(12) United States Patent
Izumi et al.

(10) Patent No.: US 6,210,477 B1
(45) Date of Patent: Apr. 3, 2001

(54) METHODS FOR PULLING A SINGLE CRYSTAL

(75) Inventors: Teruo Izumi; Hideki Watanabe, both of Hyogo (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/217,968

(22) Filed: Dec. 22, 1998

(30) Foreign Application Priority Data

Dec. 26, 1997 (JP) ..................................................... 9-361552

(51) Int. Cl.[7] ............................. C30B 15/00; C30B 27/02
(52) U.S. Cl. ............................... 117/35; 117/217; 117/902
(58) Field of Search ..................... 117/84, 18, 217, 117/35

(56) References Cited

U.S. PATENT DOCUMENTS

| | | | |
|---|---|---|---|
| 4,944,834 | * 7/1990 | Tada et al. | 156/620.5 |
| 4,956,153 | * 9/1990 | Yamagishi et al. | 422/249 |
| 5,567,399 | * 10/1996 | Von Ammon et al. | 722/245.1 |
| 5,578,123 | * 11/1996 | Vilzmann et al. | 117/13 |
| 5,720,810 | * 2/1998 | Arai et al. | 117/221 |
| 5,730,799 | * 3/1998 | Ito | 117/217 |
| 5,824,152 | * 10/1998 | Kubota et al. | 117/217 |
| 5,916,364 | * 6/1999 | Izumi | 117/13 |
| 5,932,002 | * 8/1999 | Izumi | 117/13 |
| 5,935,326 | * 8/1999 | Kotooka et al. | 117/217 |
| 5,954,875 | * 9/1999 | Kato et al. | 117/217 |

* cited by examiner

Primary Examiner—Benjamin L. Utech
Assistant Examiner—Matthew Anderson
(74) Attorney, Agent, or Firm—Wenderoth, Lind & Ponack, L.L.P.

(57) ABSTRACT

The present invention relates to methods for pulling a single crystal wherein the induction of dislocation can be inhibited and a single crystal can be held safely. An apparatus for pulling a single crystal having a straightening vane in the shape of an inverted truncated cone whose upper and lower planes are removed, which is located between a crucible and a single crystal, is used. The gap between the lower end portion of the straightening vane and the surface of a melt filled into the crucible can be selected in the range of 30–200 mm. Where the gap is set large in the range of 30–200 mm, the temperature of the front portion of a seed crystal is raised till the difference in temperature between the front portion thereof and the melt (the range of 1380–1480° C.) becomes almost zero. The seed crystal is brought into contact with the melt, a neck is formed with being heated, and a main body is pulled from the melt. Alternatively, an apparatus for pulling a single crystal having a crucible with through holes formed on the upper part thereof, or an apparatus for pulling a single crystal having an auxiliary heating means which has a body surrounding a seed crystal located near above the melt surface and a transfer mechanism for pulling the body is used in order to achieve the object.

10 Claims, 8 Drawing Sheets

(a)

(b)

(c)

(d)

(a)

(b)

METHODS FOR PULLING A SINGLE CRYSTAL

BACKGROUND OF THE INVENTION

1. Field of the Invention

The present invention relates to methods and apparatus for pulling a single crystal and, more particularly, to methods for pulling a single crystal wherein a single crystal of silicon or the like is pulled by a pulling method such as the Czochralski method (hereinafter, referred to as the CZ method), and an apparatus for pulling a single crystal.

2. Description of the Relevant Art

At present, the majority of silicon single crystals (ingots) used for manufacturing a substrate for forming a circuit component of a LSI (large scale integrated circuit) and the like have been pulled by the CZ method. FIG. 1 is a sectional view of a conventional apparatus for pulling a single crystal using the CZ method, and in the figure, reference numeral 11 represents a crucible.

The crucible 11 comprises a bottomed cylindrical quartz crucible 11a and a bottomed cylindrical graphite crucible 11b fitted on the outer side of the quartz crucible 11a. The crucible 11 is supported with a support shaft 18 which rotates in the direction shown by the arrow A in the figure at a prescribed speed. A heater 12 of a resistance heating type and a heat insulating mold 17, arranged around the heater 12, are concentrically arranged around the crucible 11. The crucible 11 is charged with a melt 13 of a material for forming a crystal which is melted by the heater 12. On the central axis of the crucible 11, a pulling axis 14 made of a pulling rod or wire, which is suspended, and at the front of the pulling rod or wire, a seed crystal 15 is held by a holder 14a. These parts are arranged within a water cooled type chamber 19 wherein pressure of the chamber can be controlled.

A method for pulling a single crystal 16 using the above-mentioned apparatus for pulling a single crystal is described below by reference to FIGS. 1 and 2. FIGS. 2(a)–(d) are partially enlarged front views diagrammatically showing the seed crystal 15 and the steps in a conventional method for pulling a single crystal.

Although it is not shown in FIG. 1, an electric current is applied to the heater 12 so as to melt the material for forming a crystal. after reducing the pressure in the chamber 19. Then, an inert gas is introduced into the chamber 19 so as to make an inert gas atmosphere at a prescribed pressure within the chamber 19.

While the pulling axis 14 is rotated on the same axis in the reverse direction of the support shaft 18 at a prescribed speed, the seed crystal 15, held by the holder 14a, is descended and is brought into contact with the melt 13 so as to make the front portion 15a of the seed crystal 15 partially melt into the melt 13. Then, the pulling of the single crystal 16 from the melt 13 is started. This is referred to as the seeding as shown in (FIG. 2(a).

In making a crystal grow at the front portion 15a of the seed crystal 15, the pulling axis 14 is pulled at a higher speed than the below-described pulling speed in the formation of a main body 16c. The crystal is narrowed to have a prescribed diameter, leading to the formation of a neck 16a. This is referred to as the necking step (FIG. 2(b)).

By slowing down the pulling speed of the pulling axis 14 (hereinafter, simply referred to as the pulling speed), the neck 16a is made to grow to have a prescribed diameter, leading to the formation of a shoulder 16b (FIG. 2(c)).

By pulling the pulling axis 14 at a fixed rate, the main body 16c having a uniform diameter and a prescribed length is formed (FIG. 2(d)).

Although it is not shown in FIG. 2, in order to prevent induction of high density dislocation to the single crystal 16 by a sudden temperature change when the separation of the single crystal 16 from the melt 13 approaches, the diameter of the single crystal 16 is gradually decreased so that the temperature of the whole single crystal 16 is gradually lowered, leading to the formation of an end-cone. Next, the single crystal 16 is separated from the melt 13. Finally, the single crystal 16 is cooled at the end of the pulling of the single crystal 16.

One of the important steps in the pulling of the single crystal 16 is the above-mentioned necking step called the Dash method (J. Appl. Phys. 30 [4] (1959) W. C. Dash. p.459–473) (FIG. 2(b)).

The object of the necking step is described below. In the above seeding step (FIG. 2(a)), the front portion 15a of the seed crystal 15 is preheated to some extent and is brought into contact with the melt 13. Ordinarily, there is a difference of 100° C. or more between the preheating temperature (about 1300° C. and less) and the melting point of the seed crystal 15 (about 1410° C.). Therefore, in contact with the melt 13, the front portion 15a of the seed crystal 15 has a steep temperature gradient, leading to the induction of dislocation caused by a thermal stress thereto. It is necessary to make the single crystal 16 grow after excluding the dislocation which propagates and inhibits single crystal growth. Since the dislocation generally tends to grow in the vertical direction to the growth interface of the single crystal 16, the shape of the growth interface (the front plane of the neck 16a) is made downward convex, so as to exclude the dislocation outward.

In the pulling of a single crystal, the faster the pulling speed, the smaller the diameter of the single crystal, or the more downwardly convex the shape of the growth interface of the single crystal. Therefore, in the above necking step, it is desired that the pulling speed be made as fast as possible to make the diameter of the neck 16a smaller, or to make the shape of the growth interface more downwardly convex, so as to efficiently exclude the dislocation outward.

In the above conventional method for pulling a single crystal, the seed crystal 15 having a diameter of, for example about 12 mm has been generally used in order to pull the single crystal 16 having a diameter of about 6 inches and a weight of 80 kg or so. In this case, the larger the diameter of the neck 16a is, the more safely the single crystal 16 can be supported, while the smaller the diameter of the neck 16a is, the more efficiently the dislocation can be excluded. In order to meet both of the requirements, the neck 16a having a diameter of 3 mm or so is selected.

Recently, however, in order to produce a more highly integrated semiconductor device at a lower cost and more efficiently, the wafer has been required to have a larger diameter. Now, for example, the production of the single crystal 16 having a diameter of about 12 inches (300 mm) and a weight of 300 kg or so is desired. When the diameter of the single crystal 16 is made larger, the weight of the shoulder 16b band tail inevitably becomes heavier. It becomes necessary to lengthen the main body 16c which can form a product in order to obtain the profitable yield. In other words, it becomes necessary to grow a heavy single crystal.

When the requirement is satisfied, the neck 16a having a conventional diameter (usually 3 mm or so) cannot withstand the weight of the pulled single crystal 16 and breaks, resulting in the falling of the single crystal 16.

In growing the above heavy single crystal 16, the diameter of the neck 16a needs to be about 5 mm or more in order to prevent the occurrence of troubles such as a fall of the single crystal 16 and to pull the single crystal 16 safely, which is calculated from the silicon strength (about 16 kgf/mm$^2$). However, when the diameter of the neck 16a is 5 mm or more, the dislocation which is induced in contact of the seed crystal 15 with the melt 13 cannot be sufficiently excluded outward.

In order to solve the problem, a method for growing a heavy single crystal was proposed in Japanese Kokai No. 62-288191, wherein the diameter is once increased after growing the neck 16a, and is reduced and is increased again, so as to form a high-strength holding portion having a large diameter. which is mechanically held. It is possible to hold the heavy single crystal by this method, but a special jig, control, and the like which are exclusive to the mechanical holding are required in order to perform the mechanical holding in the method. In addition, when the mechanical holding is conducted on the high-strength holding portion, there is a possibility that shaking or the like is given to the high-strength holding portion, so that the growing portion is caused to have dislocation by the shaking or the like. As a result, there is a probability that the yield of the product is lowered. One of the present inventors invented a method for pulling a single crystal 16, wherein by irradiating the front portion 15a of a seed crystal 15 with a laserbeam or the like from a laser beam generator or the like, the temperature of the front portion 15a of the seed crystal 15 is gradually raised so as to be almost the same temperature as that of a melt 13, and then, the seed crystal 15 is brought into contact with the melt 13, and the single crystal 16 is pulled from the melt 13 without forming a neck 16a (Japanese Patent Application No. 08-43765). In this method, since the temperature of the front portion 15a is adjusted to be made close to that of the melt 13 before the seed crystal 15 is brought into contact with the melt 13, a sudden change in temperature (thermal shock) caused by the contact with the melt 13 can be reduced and the number of induced dislocations can be decreased. Therefore, even if the neck 16a is not formed, the single crystal 16 can be pulled with a decreased number of the induced dislocations, and the single crystal 16 heavier than before can be pulled.

However, since the irradiation of the laser beam is usually conducted only from one direction, the seed crystal 15 can be heated only from one direction. so that it is difficult to uniformly heat the front portion 15a of the seed crystal 15. As a result, it is difficult to perfectly exclude the thermal shock which affects the front portion 15a in contact of the seed crystal 15 with the melt 13, so that it is difficult to perfectly inhibit the induction of the dislocations to the single crystal 16.

SUMMARY OF THE INVENTION

The present invention was developed in order to solve the above problems, and it is an object of the present invention to provide methods and apparatus for pulling a single crystal, wherein the induction of dislocation can be inhibited almost perfectly and a single crystal can be held safely even when the single crystal has a large diameter, or a heavy weight.

FIG. 3 is a sectional view diagrammatically showing the principal part of a conventional apparatus for pulling a single crystal in which a straightening vane is arranged. Here, the same marks are affixed to the same constructions as those of a conventional apparatus for pulling a single crystal shown in FIG. 1. and the descriptions thereof are omitted.

Reference numeral 10 in the figure represents a straightening vane. The straightening vane 10, having a shape of an inverted truncated cone in which the upper and lower planes are removed, surrounds a pulled single crystal 16 and is arranged so that the lower end portion thereof is located near the surface of a melt 13 within a crucible 11. Ordinarily, the gap G between the lower end portion of the straightening vane 10 and the melt surface 13a is 15–20 mm or so.

In a series of processes for pulling the single crystal 16, the straightening vane 10 shown in FIG. 3 is often used in order to efficiently eliminate silicon vapor, oxygen, and the like from the system. Therefore, the gap G is controlled from the viewpoint of the oxygen concentration control and the growth rate control.

The present inventors brought seed crystals 15 having various diameters into contact with the melt 13 with the conditions of various gaps (for example, various values between 15 mm and 45 mm) and further formed necks 16a having various diameters, so as to examine the incidence of dislocations. As a result, they ascertained that as the gap G becomes larger, the dislocation-free rate is improved while the number of induced dislocations on the contact interface of the melt 13 decreases. They also ascertained that as the diameters of the seed crystal 15 and the neck 16a become smaller, the dislocation-free rate is improved.

Furthermore, the present inventors formed through holes (slits) on the upper part of a graphite crucible 11b (FIG. 1), and brought the seed crystals 15 having various diameters into contact with the melt 13 with the conditions of various slit opening ratios (ratios of the total horizontal length of the slits to the perimeter of the crucible 11) and various heights of the slits (including the case of no slit), so as to examine the incidence of dislocations. As a result, they found that when the graphite crucible 11b having the slits formed with the conditions of the opening ratios and the heights within certain ranges is used, the induction of dislocations can be inhibited even if a large seed crystal 15 having a diameter of 10 mm or so is used.

It appears that the reasons for the above new knowledge are as follows.

1. With a larger gap G (or through the slits), the radiant quantity of a heater 12 to the seed crystal 15 increases, so that the temperature of the front portion 15a of the seed crystal 15 is easily raised. Therefore, the difference in temperature between the front portion 15a and the melt 13 in contact of the seed crystal 15 with the melt 13 becomes smaller, so that a thermal shock in the contact is reduced, leading to a decrease in number of the induced dislocations in the contact.

2. As the diameter of the seed crystal 15 becomes smaller, the heat capacity in the front portion 15a of the seed crystal 15 decreases, so that the temperature of the front portion 15a changes smoothly based on the difference in temperature between the front portion 15a and the melt 13 in the contact. Therefore, the temperature distribution in the horizontal direction of the front portion 15a becomes difficult to be caused in the contact, so that a thermal stress which affects the front portion 15a becomes smaller, leading to a decrease in number of the induced dislocations in the contact.

3. With a larger gap G (or through the slits), the radiant quantity of the heater 12 to the neck 16a increases in the formation of the neck 16a. FIG. 4(a) is a diagram showing the temperature distribution in the neck 16a in the formation of the neck 16a when the radiant quantity 12a is increased, and FIG. 4(b) is a diagram showing the temperature distribution in the neck 16a in the formation of the neck 16a by a conventional method.

In FIG. 4(b), since the neck 16a is strongly cooled by the flow of Ar gas, the isothermal line $L_b$ is upward convex. In FIG. 4(a), since the radiant quantity 12a of the heater 12 is increased, the isothermal line $L_a$ is close to a plane in shape. The temperature gradient of the neck 16a in the horizontal direction becomes small, the thermal stress which affects the neck 16a is reduced, and the speed of dislocation movement decreases. As a result, the speed of propagation of the dislocation becomes low, so that the dislocation elimination ability in the neck 16a increases.

The present inventors further found from the above new knowledge, the reasons thereof, and the like that it is possible to reduce the number of induced dislocations in the contact and to increase the dislocation rejection ability in the neck 16a by making the front portion 15a of the seed crystal 15 uniformly hot from the whole periphery thereof, or heating the neck 16a, using an apparatus for pulling a single crystal having an auxiliary heating means wherein a heating body is located so as to surround the seed crystal 15 and/or the neck 16a.

In the method for pulling a single crystal (1) according to the present invention, an apparatus for pulling a single crystal having a crucible to be charged with a melt, a heater located around the crucible, and a straightening vane is used. The straightening vane has a body surrounding a pulled single crystal in the shape of an inverted truncated cone or a cylinder in which the upper and lower planes are removed, which is located between the crucible and the single crystal. The gap between the lower end portion of the body and the surface of the melt filled into the crucible (hereinafter, referred to as the gap) can be selected in the range of 30–200 mm. The method for pulling a single crystal (1) is characterized by using the above apparatus, raising the temperature of the front portion of the seed crystal till the difference in temperature between the front portion and the melt (1380–1480° C.) becomes almost zero, where the above gap is set large, bringing the seed crystal into contact with the melt, and pulling the single crystal without forming a neck.

In the method for pulling a single crystal (1), since the temperature of the front portion of the seed crystal is made close to that of the melt until both of them can be deemed almost the same before bringing the seed crystal into contact with the melt, a thermal shock in the front portion of the seed crystal caused by the contact with the melt can be reduced, leading to an inhibition of the induction of dislocations. Therefore, even if the neck is not formed, a dislocation-free single crystal can be pulled. Even a heavier single crystal than before can be sufficiently supported in the pulling thereof.

Since an apparatus having only an alteration of the gap G between the lower end portion of the body of the straightening vane and the surface of the melt filled into the crucible is used, a new special jig or the like is not required, so that an increase in cost of the pulling of a single crystal is not caused, compared with a conventional method. Since the neck need not be formed, the size of the whole seed crystal can be smaller than that in a usual pulling method. Therefore, since a cheaper seed crystal can be used, the cost of the pulling of a single crystal can be reduced.

The method for pulling a single crystal (2) according to the present invention is characterized by using an apparatus for pulling a single crystal having a crucible to be charged with a melt, a heater located around the crucible, and the like, wherein through holes and/or slits are formed on the upper part of the crucible, bringing a seed crystal into contact with the melt after raising the temperature of the front portion of the seed crystal until the difference in temperature between the front portion and the melt becomes almost zero, and pulling a single crystal without forming a neck.

The shapes of the through holes are not limited in any way, which are allowed to be a circle, an ellipse, or the like, besides a rectangle.

The slits described here, which are not included in the through holes, are in the form of a cut or the like, having an open upper part unlike the through holes, and the shapes thereof are not limited in any way, similarly to those of the through holes.

In the method for pulling a single crystal (2), since the temperature of the front portion of the seed crystal is made close to that of the melt until both of them can be deemed almost the same before bringing the seed crystal into contact with the melt, a thermal shock in the front portion of the seed crystal caused by the contact with the melt can be reduced, leading to an inhibition of the induction of dislocations. Therefore, even if the neck is not formed, a dislocation-free single crystal can be pulled. Even a heavier single crystal than before can be sufficiently supported in the pulling thereof.

Since an apparatus having only a difference that the through holes and/or slits are formed on the crucible is used, a new special jig or the like is not required, so that almost no increase in cost of the pulling of a single crystal is caused, compared with a conventional method. Since the neck need not be formed, the size of the whole seed crystal can be smaller than that in a usual pulling method. Therefore, since a cheaper seed crystal can be used, the cost of the pulling of a single crystal can be reduced.

The method for pulling a single crystal (3) according to the present invention is characterized by using an apparatus for pulling a single crystal having a crucible to be charged with a melt, a heater located around the crucible, and an auxiliary heating means which has a body surrounding a seed crystal located near above the melt surface and a transfer mechanism for pulling the body, bringing the seed crystal into contact with the melt after raising the temperature of the front portion of the seed crystal using the auxiliary heating means until the difference in temperature between the front portion and the melt becomes almost zero, and pulling a single crystal without forming a neck.

In the method for pulling a single crystal (3), since the temperature of the front portion of the seed crystal is made close to that of the melt until both of them can be deemed almost the same before bringing the seed crystal into contact with the melt, a thermal shock in the front portion of the seed crystal caused by the contact with the melt can be reduced, leading to an inhibition of the induction of dislocations. Therefore, even if the neck is not formed, a dislocation-free single crystal can be pulled. Even a heavier single crystal than before can be sufficiently supported in the pulling thereof.

Since the neck need not be formed, the size of the whole seed crystal can be smaller than that in a usual pulling method. Therefore, since a cheaper seed crystal can be used, the cost of the pulling of a single crystal can be reduced. In the formation of a main body and the like, the body of the auxiliary heating means can be pulled upward by the transfer mechanism so that the body thereof is out of the way of the pulling of a single crystal.

The method for pulling a single crystal (4) according to the present invention is characterized by using an apparatus for pulling a single crystal wherein through holes and/or slits are formed on the upper part of a crucible in the method for pulling a single crystal (1).

In the method for pulling a single crystal (4), the gap G between the lower end portion of the body of the straightening vane and the surface of the melt filled into the crucible is set to be large, and in addition, the crucible having the through holes and/or slits formed on the upper part thereof is used. Therefore, the temperature of the front portion of the seed crystal can be made close to that of the melt more easily.

The method for pulling a single crystal (5) according to the present invention is characterized by using an apparatus for pulling a single crystal having the crucible on which through holes and/or slits having a ratio of the total horizontal length of 10% or more to the perimeter of the crucible are formed in the method for pulling a single crystal (2) or (4).

In the method for pulling a single crystal (5), since the crucible which has the through holes and/or slits having a ratio of the total horizontal length of 10% or more to the perimeter of the crucible is used, the front portion of the seed crystal can be rapidly heated efficiently.

The method for pulling a single crystal (6) according to the present invention is characterized by using an apparatus having an auxiliary heating means which has a body surrounding a seed crystal located near above the melt surface and a transfer mechanism for pulling the body in the method for pulling a single crystal (1), (2), (4), or (5).

In the method for pulling a single crystal (6), by using the apparatus having the auxiliary heating means wherein the body can be positioned so as to surround the seed crystal, the temperature of the front portion of the seed crystal can be made close to that of the melt easily and uniformly. In the formation of a main body and the like, the body of the auxiliary heating means can be pulled upward by the transfer mechanism so that the body thereof is out of the way of the pulling of a single crystal.

In the method for pulling a single crystal (7) according to the present invention, an apparatus for pulling a single crystal having a crucible to be charged with a melt, a heater located around the crucible, and a straightening vane is used. The straightening vane has a body surrounding a pulled single crystal in the shape of an inverted truncated cone or a cylinder in which the upper and lower planes are removed, which is located between the crucible and the single crystal. The gap between the lower end portion of the body and the surface of the melt filled into the crucible (hereinafter, referred to as the gap) can be selected in the range of 30–200 mm. The method for pulling a single crystal (7) is characterized by using the above apparatus, bringing a seed crystal into contact with the melt where the gap is set to be large, and forming a neck with heating in a method for pulling a single crystal wherein the seed crystal is brought into contact with the melt filled in the crucible, the neck is formed by pulling the seed crystal, and a main body is pulled.

In the method for pulling a single crystal (7), by forming the neck with heating, the heat distribution in the neck is made planer and a thermal stress which affects the neck is reduced, so that the dislocation elimination ability in the neck can be increased. Therefore, since the dislocation can be eliminated even if the neck has a larger diameter, the single crystal can be pulled without propagating the dislocation even if a conventional neck having a small diameter is not formed. Even a heavier single crystal than before can be sufficiently supported in the pulling thereof. Since an apparatus having only an alteration of the gap G, compared with a conventional method, is used, a new special jig or the like is not required, so that an increase in cost is not caused.

The method for pulling a single crystal (8) according to the present invention is characterized by using an apparatus for pulling a single crystal having a heater located around a crucible and the crucible which has through holes and/or slits formed on the upper part thereof, forming a neck with heating in a method for pulling a single crystal wherein a seed crystal is brought into contact with a melt filled in the crucible, the neck is formed by pulling the seed crystal, and a main body is pulled.

In the method for pulling a single crystal (8), by heating the neck, the heat distribution in the neck is made planer and a thermal stress which affects the neck is reduced, so that the dislocation elimination ability in the neck can be increased. Therefore, since the dislocation can be eliminated even if the neck has a larger diameter, the single crystal can be pulled without propagating the dislocation even if a conventional neck having a small diameter is not formed. Even a heavier single crystal than before can be sufficiently supported in the pulling thereof. Since an apparatus having only a difference that the through holes and/or slits are formed on the crucible, compared with a conventional method, is used, a new special jig or the like is not required, so that a large increase in cost is not caused.

The method for pulling a single crystal (9) according to the present invention is characterized by using an apparatus for pulling a single crystal which has a heater located around a crucible and an auxiliary heating means having a body surrounding a seed crystal located near above a melt and a transfer mechanism for pulling the body, forming a neck with heating in a method for pulling a single crystal wherein the seed crystal is brought into contact with the melt filled in the crucible, the neck is formed by pulling the seed crystal, and a main body is pulled.

In the method for pulling a single crystal (9), by heating the neck, the heat distribution in the neck is made planer and a thermal stress which affects the neck is reduced, so that the dislocation elimination ability in the neck can be increased. Therefore, since the dislocation can be eliminated even if the neck has a larger diameter, the single crystal can be pulled without propagating the dislocation even if a conventional neck having a small diameter is not formed. Even a heavier single crystal than before can be sufficiently supported in the pulling thereof. In the formation of a main body and the like, the body of the auxiliary heating means can be pulled upward by the transfer mechanism so that the body thereof is out of the way of the pulling of a single crystal.

The method for pulling a single crystal (10) according to the present invention is characterized by using an apparatus for pulling a single crystal wherein through holes and/or slits are formed on the upper part of a crucible in the method for pulling a single crystal (7).

In the method for pulling a single crystal (10), by using the crucible having the through holes and/or slits formed on the upper part thereof, the neck can be heated more easily. As a result, the dislocation elimination ability in the neck can be further increased.

The method for pulling a single crystal (11) according to the present invention is characterized by using an apparatus for pulling a single crystal having the crucible on which through holes and/or slits having a ratio of the total horizontal length of 10% or more to the perimeter of the crucible are formed in the method for pulling a single crystal (8) or (10).

In the method for pulling a single crystal (11), by using the crucible on which the through holes and/or slits having a ratio of the total horizontal length of 10% or more to the perimeter of the crucible are formed, the neck can be sufficiently heated.

The method for pulling a single crystal (12) according to the present invention is characterized by using an apparatus having an auxiliary heating means which has a body surrounding a seed crystal located near above the melt surface and a transfer mechanism for pulling the body in the method for pulling a single crystal (7), (8), (10), or (11).

In the method for pulling a single crystal (12), by using the apparatus having the auxiliary heating means wherein the body is positioned so as to surround the neck and the like, the neck can be heated easily and uniformly. As a result, the dislocation elimination ability in the neck can be further increased. In the formation of a main body and the like, the body of the auxiliary heating means can be pulled upward by the transfer mechanism so that the body thereof is out of the way of the pulling of a single crystal.

The method for pulling a single crystal (13) according to the present invention is characterized by forming a neck having a diameter of 5–15 mm in one of the methods for pulling a single crystal (7)–(12).

In the method for pulling a single crystal (13), since the diameter of the neck is 5 mm or more, even a single crystal whose main body has a diameter of about 12 inches, having a heavy weight of 300 kg or so can be sufficiently supported in the pulling thereof. Since the diameter of the neck is 15 mm and less, the heat distribution in the neck becomes planer, so that the high dislocation elimination ability can be obtained in the neck.

The method for pulling a single crystal (14) according to the present invention is characterized by bringing the seed crystal into contact with the melt after raising the temperature of the front portion of the seed crystal until the difference in temperature between the front portion and the melt (1380–1480° C.) becomes almost zero in one of the methods for pulling a single crystal (7)–(13).

In the method for pulling a single crystal (14), since the temperature of the front portion of the seed crystal is made close to that of the melt (1380–1480° C. until both of them can be deemed almost the same before bringing the seed crystal into contact with the melt, a thermal shock in the front portion of the seed crystal caused by the contact with the melt can be reduced, leading to an inhibition of the induction of dislocations. Furthermore, by forming the neck with heating, the heat distribution in the neck is made planer and the thermal stress which affects the neck is reduced, so that the dislocation elimination ability in the neck can be increased. Therefore, even if a seed crystal having a large diameter is used, the number of induced dislocations can be eliminated, and even if the neck has a larger diameter, the dislocations can be rejected. Even if a seed crystal having a large diameter is used and the neck has a larger diameter, a single crystal can be pulled without propagating the dislocations. Even when a heavier dislocation-free single crystal than before is pulled, the single crystal can be sufficiently supported.

The method for pulling a single crystal (15) according to the present invention is characterized by bringing a seed crystal into contact with a melt after raising the temperature of the front portion of the seed crystal to 1380–1480° C. in one of the methods for pulling a single crystal (1)–(6), or (14).

In the method for pulling a single crystal (15), the seed crystal can be brought into contact with the melt with almost no dislocation induced.

The method for pulling a single crystal (16) according to the present invention is characterized by using a seed crystal having a diameter of 5–15 mm in one of the methods for pulling a single crystal (1)–(15).

In the method for pulling a single crystal (16), since the diameter of the seed crystal is 5 mm or more, even a single crystal whose main body has a diameter of about 12 inches, having a heavy weight of 300 kg or so can be sufficiently supported in the pulling thereof. Since the diameter of the seed crystal is 15 mm and less, the front portion of the seed crystal can be heated sufficiently before the contact with the melt, so that a thermal shock in contact with the melt can be inhibited.

The apparatus for pulling a single crystal (1) according to the present invention has a crucible to be charged with a melt, a heater located around the crucible, and a straightening vane having a body surrounding a pulled single crystal in the shape of an inverted truncated cone or a cylinder in which the upper and lower planes are removed. The body is located between the crucible and the single crystal, and the lower end portion thereof can be positioned near above the surface of the melt filled in the crucible. The apparatus for pulling a single crystal (1) is characterized by the gap between the melt surface and the lower end portion of the body (hereinafter, referred to as the gap) selected in the range of 30–200 mm.

In the apparatus for pulling a single crystal (1), since the range of the gap G is 30–200 mm. which is wide, the temperature of the front portion of the seed crystal can be raised close to that of the melt before bringing the seed crystal into contact with the melt, and a neck can be formed with heating. Accordingly, the induction of dislocations caused by a thermal shock in bringing the seed crystal into contact with the melt can be reduced, and the dislocation elimination ability in the neck can be increased. Therefore, even if a seed crystal having a large diameter is used, the number of induced dislocations can be reduced, and even if the neck has a larger diameter, the dislocations can be eliminated. As a result, a single crystal can be pulled without propagating the dislocations. Even a heavier single crystal than before can be sufficiently supported in the pulling thereof. Since the apparatus has only a difference of a larger gap G. compared with a conventional apparatus, a new special jig or the like is not required, so that an increase in cost is not caused.

The apparatus for pulling a single crystal (2) according to the present invention is characterized by through holes and/or slits formed on the upper part of a crucible in an apparatus for pulling a single crystal having the crucible to be ch arged with a melt, and a heater located around the crucible.

In the apparatus for pulling a single crystal (2), since the through holes and/or slits are formed on the upper part of the crucible, the temperature of the front portion of the seed crystal can be raised close to that of the melt before bringing the seed crystal into contact with the melt, and a neck can be formed with heating. Accordingly, the induction of dislocations caused by a thermal shock in bringing the seed crystal into contact with the melt can be reduced, and the dislocation elimination ability in the neck can be increased. Therefore, even if a seed crystal having a large diameter is used, the number of induced dislocations can be reduced, and even if the neck has a larger diameter, the dislocations can be eliminated. As a result, a single crystal can be pulled without propagating the dislocations. Even a heavier single crystal than before can be sufficiently supported in the pulling thereof. Since the apparatus has only a difference of through holes and/or slits formed on the crucible in a conventional apparatus, a new special jig or the like is not required, so that a large increase in cost is not caused.

The apparatus for pulling a single crystal (3) according to the present invention is characterized by having an auxiliary heating means which has a body surrounding a seed crystal and/or a neck located near above the melt surface and a transfer mechanism for pulling the body in an apparatus for pulling a single crystal having a crucible to be charged with the melt and a heater located around the crucible.

In the apparatus for pulling a single crystal (3), since the auxiliary heating means whose body can be positioned so as to surround the seed crystal and/or the neck is included, the temperature of the front portion of the seed crystal can be raised close to that of the melt before bringing the seed crystal into contact with the melt, and the neck can be formed with heating. Accordingly, the induction of dislocations caused by a thermal shock in bringing the seed crystal into contact with the melt can be reduced, and the dislocation elimination ability in the neck can be increased. Therefore, even if a seed crystal having a large diameter is used, the number of induced dislocations can be reduced, and even if the neck has a larger diameter, the dislocations can be eliminated. As a result, a single crystal can be pulled without propagating the dislocations. Even a heavier single crystal than before can be sufficiently supported in the pulling thereof. In the formation of a main body and the like, the body of the auxiliary heating means can be pulled upward by the transfer mechanism so that the body thereof is out of the way of the pulling of a single crystal.

The apparatus for pulling a single crystal (4) according to the present invention is characterized by through holes and/or slits formed on the upper part of a crucible in the apparatus for pulling a single crystal (1).

In the apparatus for pulling a single crystal (4), since the through holes and/or slits are formed on the upper part of the crucible, the temperature of the front portion of the seed crystal can be raised close to that of the melt more easily before bringing the seed crystal into contact with the melt, and the neck can be formed with heating.

The apparatus for pulling a single crystal (5) according to the present invention is characterized by the ratio of the total horizontal length of through holes and/or slits of 10% or more to the perimeter of a crucible in the apparatus for pulling a single crystal (2) or (4).

In the apparatus for pulling a single crystal (5), since the ratio of the total horizontal length of the through holes and/or slits is 10% or more to the perimeter of the crucible, the seed crystal and the neck can be heated sufficiently rapidly.

The apparatus for pulling a single crystal (6) according to the present invention is characterized by having an auxiliary heating means which has a body surrounding a seed crystal and/or a neck located near above the melt surface and a transfer mechanism for pulling the body in the apparatus for pulling a single crystal (1), (2), (4), or (5).

In the apparatus for pulling a single crystal (6), since the auxiliary heating means whose body can be positioned so as to surround the seed crystal and/or the neck is included, the temperature of the front portion of the seed crystal can be raised close to that of the melt easily and uniformly before bringing the seed crystal into contact with the melt, and the neck can be formed with heating. Accordingly, the induction of dislocations caused by a thermal shock in bringing the seed crystal into contact with the melt can be reduced, and the dislocation elimination ability in the neck can be increased. Therefore, even if a seed crystal having a large diameter is used, the number of induced dislocations can be reduced, and even if the neck has a larger diameter, the dislocations can be eliminated. As a result, a single crystal can be pulled without propagating the dislocations. Even a heavier single crystal than before can be sufficiently supported in the pulling thereof. In the formation of a main body and the like, the body of the auxiliary heating means can be pulled upward by the transfer mechanism so that the body thereof is out of the way of the pulling of a single crystal.

DETAILED DESCRIPTION OF THE PREFERRED EMBODIMENTS

The preferred embodiments of the methods and apparatus for pulling a single crystal according to the present invention are described below by reference to the Figures of the drawings. Here, it is premised that a single crystal having a large diameter of 12 inches (about 300 mm) or more, or having a heavy weight is pulled.

Figure 1:
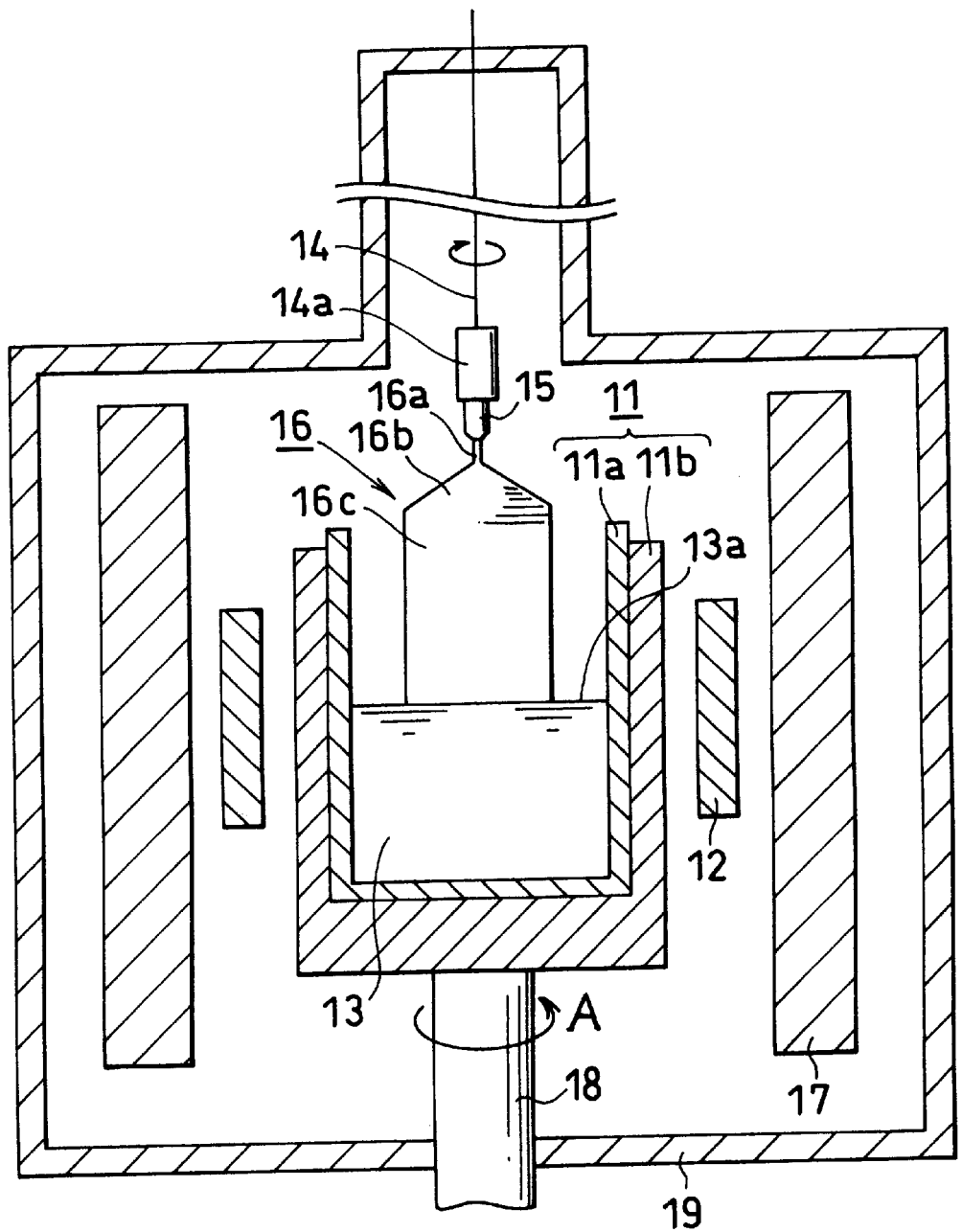
FIG. 1 is a diagrammatic sectional view showing a conventional apparatus for pulling a single crystal used for the CZ method.
Figure 2:
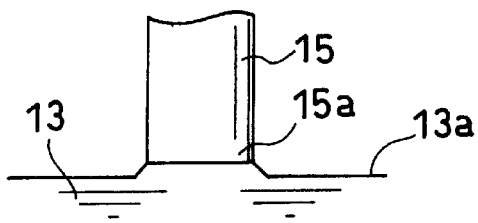
FIGS. 2(a), 2(b), 2(c), 2(d) are partial enlarged front views diagrammatically showing a seed crystal and the steps in a conventional method for pulling a single crystal.
Figure 2:
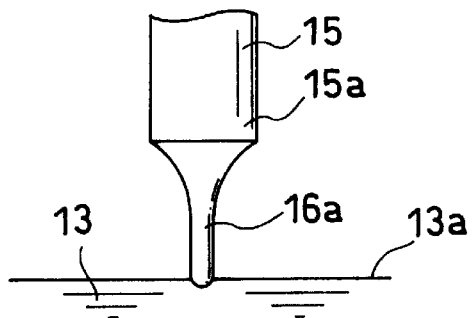
Figure 2:
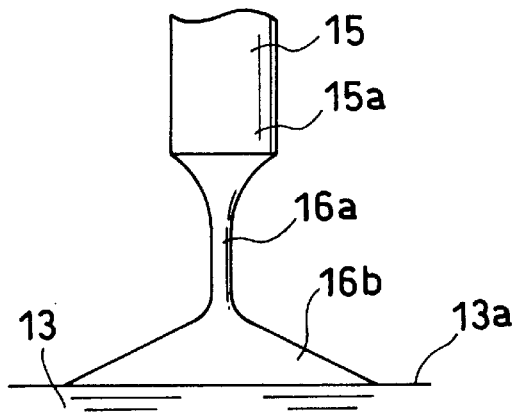
Figure 2:
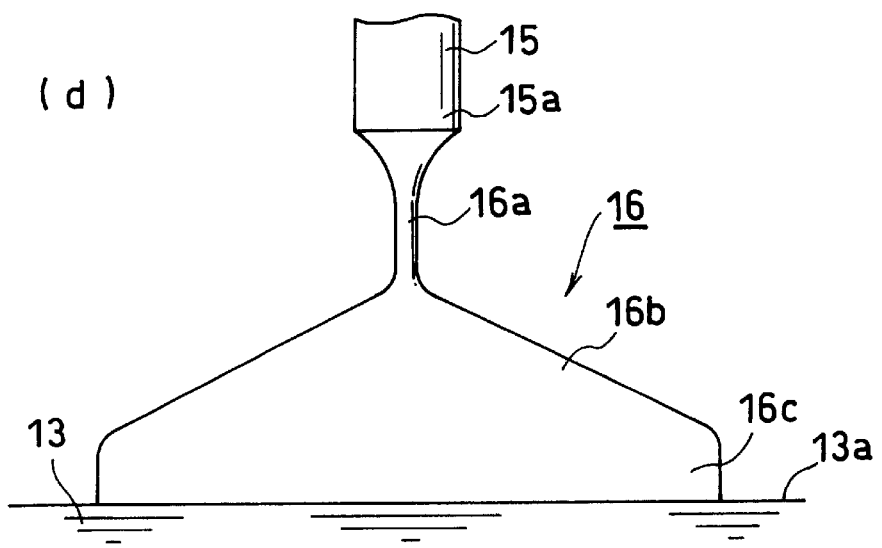
Figure 3:
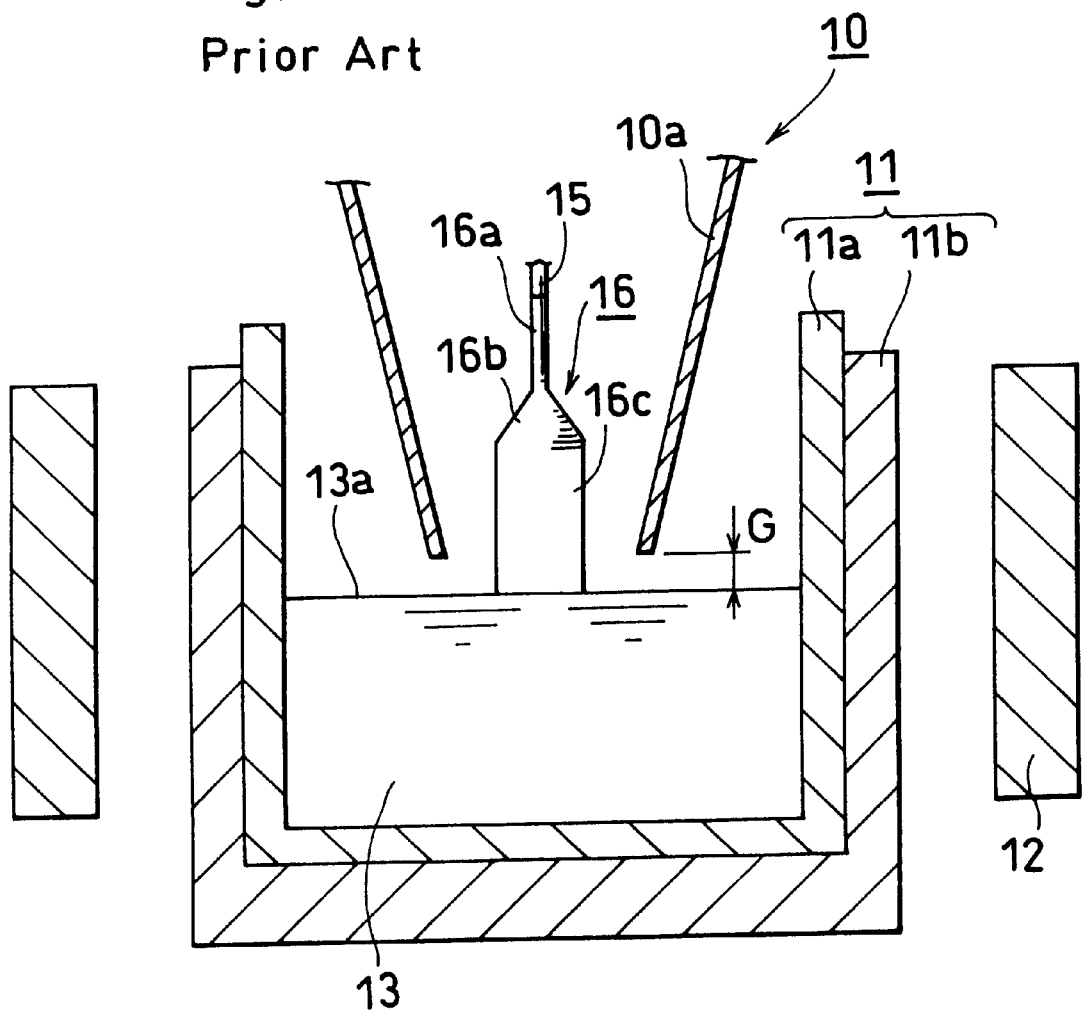
FIG. 3 is a diagrammatic sectional view showing the principal part of a conventional apparatus for pulling a single crystal in which a straightening vane is arranged.
Figure 4:
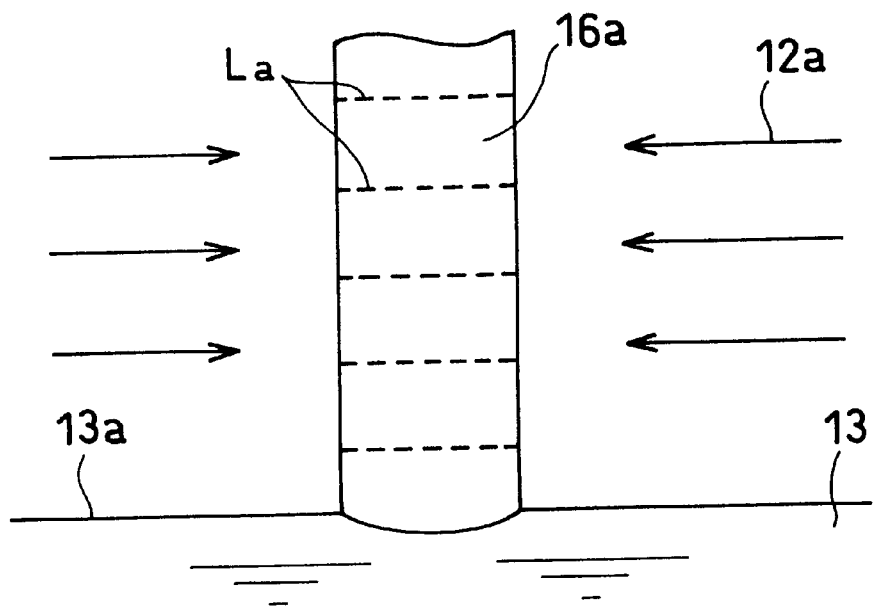
FIG. 4(a) is a diagram showing a temperature distribution in a neck when the radiant quantity is increased.
FIG. 4(b) is a diagram showing a temperature distribution in a neck in a conventional method.
Figure 4:
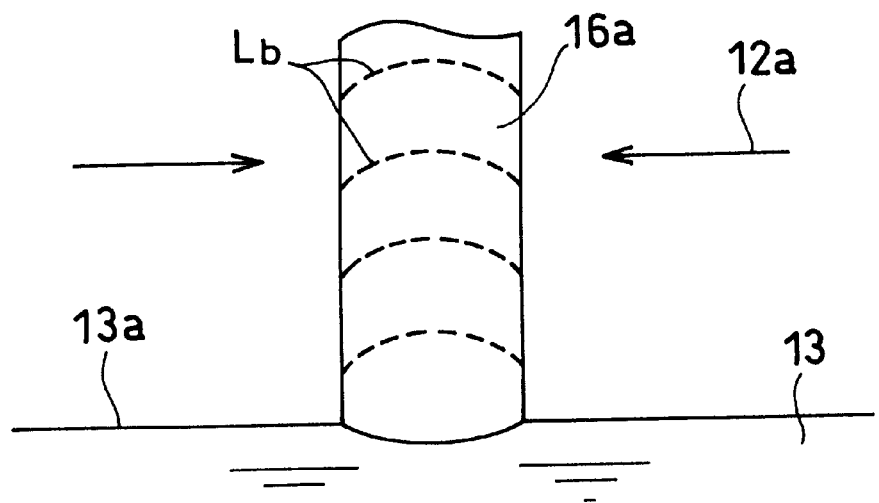

Since the apparatus for pulling a single crystal according to Embodiment (1) of the present invention has the same construction as a conventional apparatus for pulling a single crystal shown in FIG. 1 except that a straightening vane is arranged therein, only the part related to the straightening vane is described here.

Figure 5:
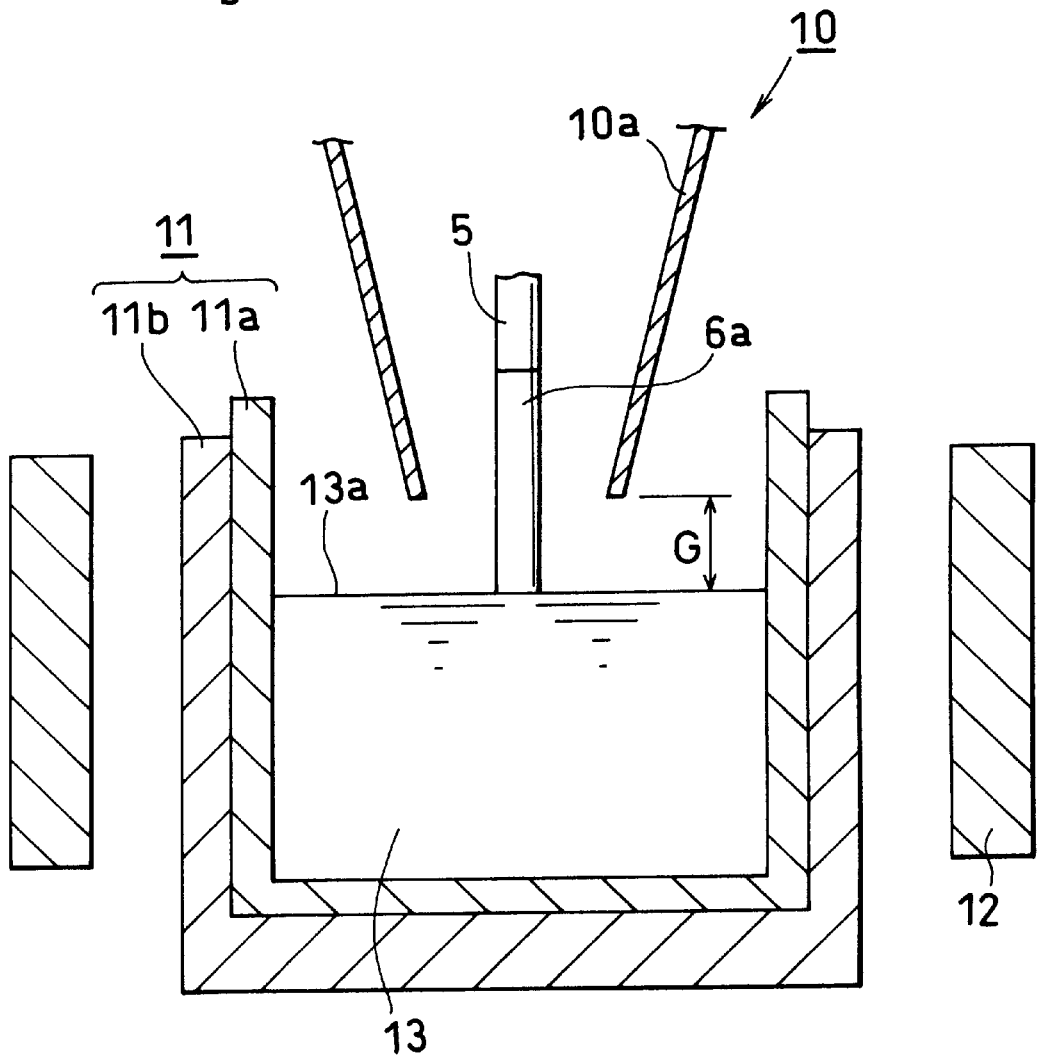
FIG. 5 is a diagrammatic sectional view showing the principal part of an apparatus for pulling a single crystal according to Embodiment (1) of the present invention.

FIG. 5 is a diagrammatic sectional view showing the principal part of the apparatus for pulling a single crystal according to Embodiment (1). Reference numeral 10 in the figure represents a straightening vane. The straightening vane 10, having a shape of an inverted truncated cone in which the upper and lower planes are removed, surrounds a pulled single crystal 6. The lower end portion thereof is located above the surface 13a of a melt filled in a crucible 11 so that the gap G between the melt surface 13a and the lower end portion of the straightening vane 10 is 30–200 mm.

Since the apparatus for pulling a single crystal according to Embodiment (2) has the same construction as the conventional apparatus for pulling a single crystal shown in FIG. 1 except that through holes (or slits) are formed on a graphite crucible, only the part related to the through holes is described here.

Figure 6:
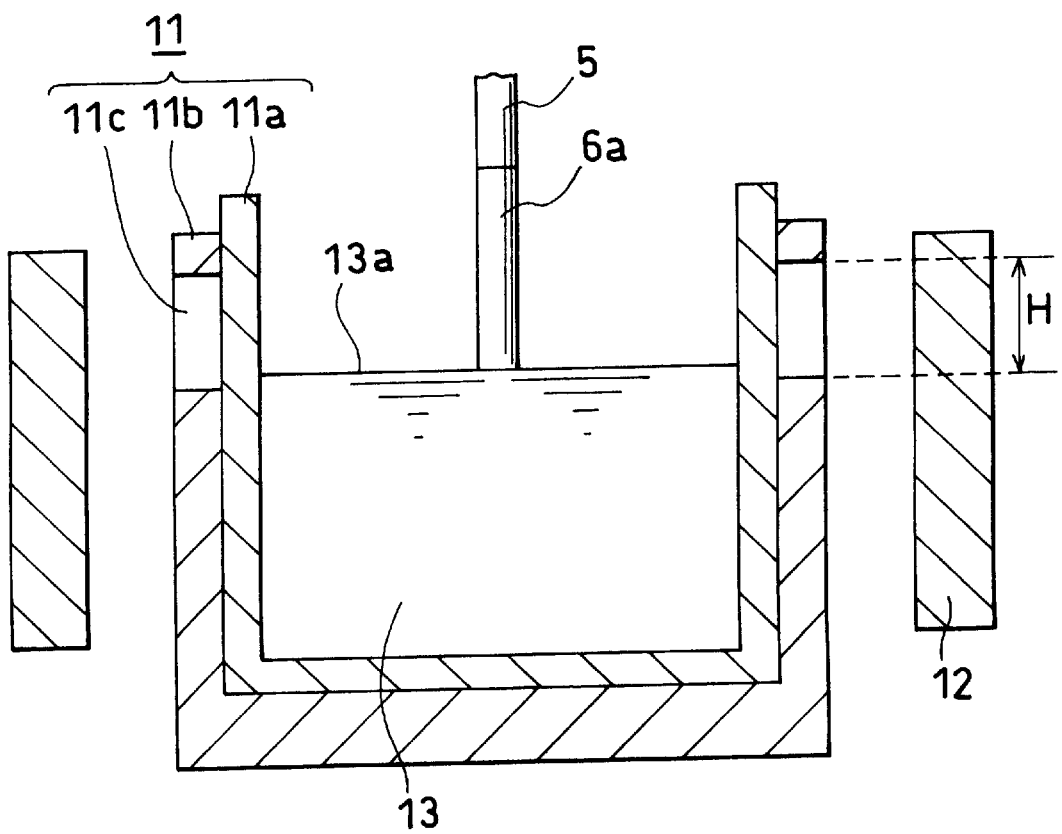
FIG. 6 is a diagrammatic sectional view showing the principal part of an apparatus for pulling a single crystal according to Embodiment (2)

FIG. 6 is a diagrammatic sectional view showing the principal part of the apparatus for pulling a single crystal according to Embodiment (2). Reference numeral 11b in the figure represents a graphite crucible. The graphite crucible 11b is fitted on the outer side of a quartz crucible 11a. Plural through holes 11c are formed on the upper part of the graphite crucible 11b. The horizontal length of the through hole 11c is selected so that the ratio of the total horizontal length of the plural through holes 11c to the perimeter of the graphite crucible 11b is 10% or more. It is desired that the plural through holes 11c be spaced uniformly on the upper part of the whole periphery of the graphite crucible 11b, for the reason that the temperature of the front portion 5a of a seed crystal 5 can be raised uniformly from the whole periphery thereof or the like.

By using the apparatus for pulling a single crystal according to the Embodiment (1) or (2), it becomes possible to easily raise the temperature of the front portion 5a of the seed crystal 5 close to that of a melt 13 before bringing the seed crystal 5 into contact with the melt 13, and to heat a formed neck 6a.

The method for pulling a single crystal wherein the apparatus for pulling a single crystal according to the Embodiment (1) or (2) is used, is described below. FIGS. 7(a)–(e) are partial enlarged front views diagrammatically showing a seed crystal and the vicinity thereof in part of the steps in a method for pulling a single crystal according to the Embodiments.

The steps before the below-described steps are conducted in the same manner as described in the Relevant Art.

While a pulling axis 14 is rotated on the same axis in the reverse direction of a support shaft 18 at a prescribed speed, a seed crystal 5 held by a holder 14a is caused to descend close to the surface of a melt 13. The seed crystal 5 is preheated so as to raise the temperature of the front portion 5a of the seed crystal 5 (FIG. 7(a)).

By using a seed crystal 5 having a small diameter, the cost of the seed crystal 5 can be reduced, and the heat capacity of the front portion 5a decreases, so that the temperature of the front portion 5a can be easily changed in contact of the seed crystal 5 with the melt 13. A temperature distribution in the horizontal direction of the front portion 5a in contact of the seed crystal 5 with the melt 13 becomes difficult to be caused, so that a thermal stress which affects the front portion 5a becomes small, leading to a decrease in number of induced dislocations in contact with the melt 13.

However, when the seed crystal 5 has a diameter of less than 5 mm, it is difficult to obtain a sufficient load capacity to a heavy single crystal. Therefore, the seed crystal 5 preferably has a diameter of 5 mm or more.

To the contrary, when the seed crystal 5 has a diameter of more than 15 mm, it is difficult to sufficiently heat the front portion 5a of the seed crystal 5 before the contact with the melt 13. Therefore, the seed crystal 5 preferably has a diameter of 5–15 mm from that viewpoint.

Since the seed crystal 5 has a melting point of about 1410° C., the temperature of the front portion 5a of the seed crystal 5 is eventually raised to 1380–1480° C. In a conventional method wherein an apparatus, not having a large gap G between the melt surface 13a and the lower end portion of a straightening vane 10, or having no through hole 11c, is used, the temperature of the front portion 5a can be raised only to 1300° C. or so, even if the preheating time is 5–120 minutes or so, which is long. However, since the radiant quantity of a heater 12 to the seed crystal 5 is increased by using the above apparatus (FIGS. 5 and/or 6), the temperature of the front portion 5a can be easily raised close to that of the melt 13.

When the temperature of the front portion 5a is less than 1380° C. in contact of the seed crystal 5 with the melt 13, the dislocations caused by a thermal stress are induced to the seed crystal 5 in contact of the seed crystal 5 with the melt 13. On the other hand, when the temperature of the front portion 5a exceeds 1480° C. the viscosity of the front melting portion of the seed crystal 5 is lowered, leading to the falling of the front melting portion from the front portion 5a.

Figure 7:
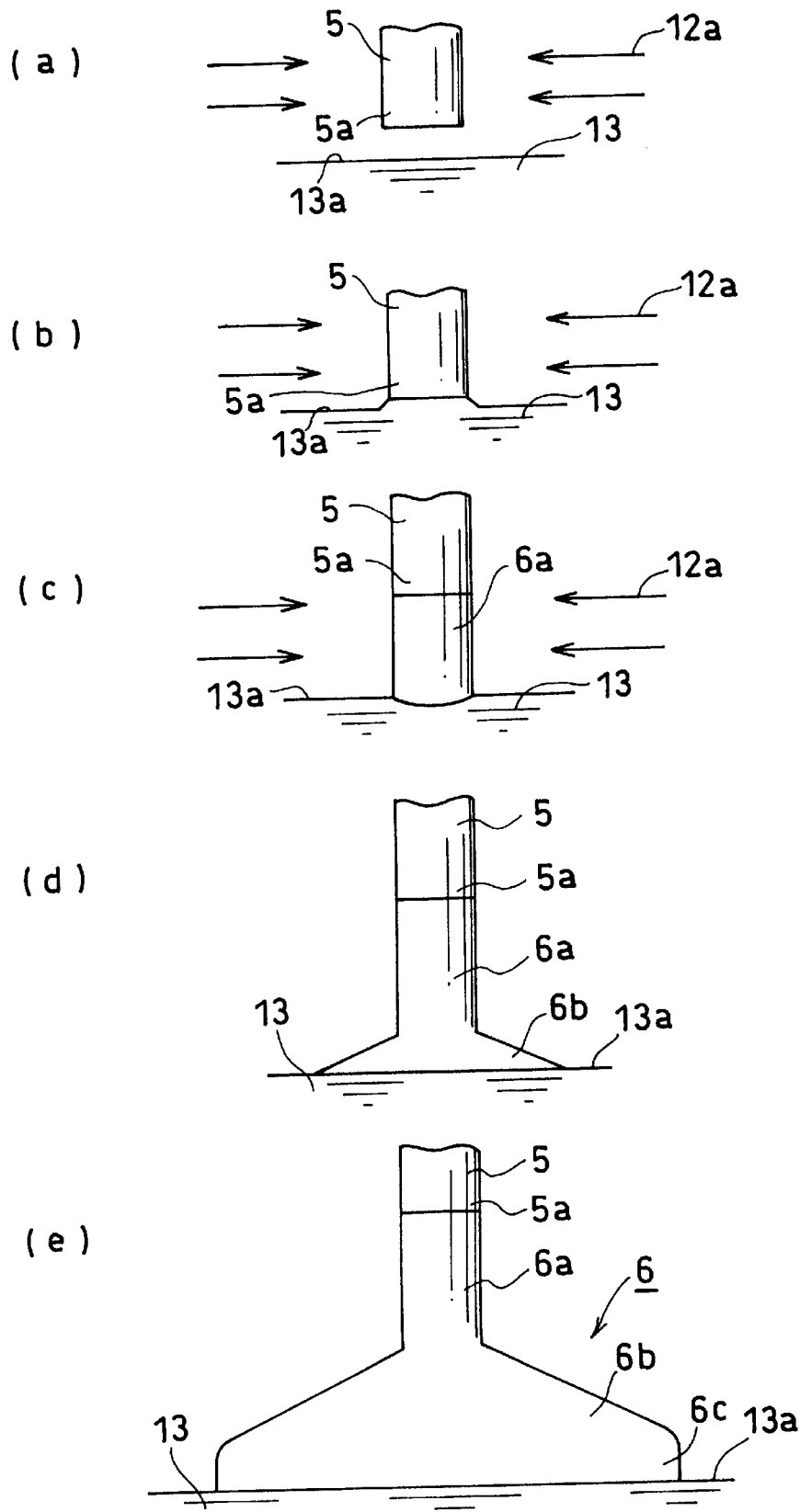
FIGS. 7(a), 7(b), 7(c), 7(d), and 7(e) are partial enlarged front views diagrammatically showing a seed crystal and the vicinity thereof in part of the steps in a method for pulling a single crystal according to the Embodiments.

The seed crystal 5 is caused to descend and the front portion 5a is brought into contact with the melt surface 13a (FIG. 7(b)). Since the difference in temperature between the front portion 5a of the seed crystal 5 and the melt 13 is small in this contact, a thermal stress caused by the difference in temperature hardly affects the seed crystal 5, so that the number of induced dislocations caused by the thermal stress decreases.

In making a single crystal grow at the front of the seed crystal 5, the pulling axis 14 is pulled at a higher speed than the below-described speed of the formation of a main body 6c. By making the shape of the growth interface (the front plane of a neck 6a) of a single crystal 6 downward convex, the neck 6a is formed (FIG. 7(c)). In a conventional method, the propagation of dislocations is inhibited by narrowing the diameter of the neck 6a. However, by using the above apparatus (FIGS. 5 and/or 6) the neck 6a wherein the dislocations can be eliminated can be formed without narrowing the diameter of the neck 6a. The reason is that the dislocation elimination ability in the neck 6a increases, since the heat distribution in the neck 6a is made planer by an increase in radiant quantity of the heater 12 to the neck 6a which is being pulled, leading to a decrease of the thermal stress which affects the neck 6a.

The neck 6a preferably has a diameter of 5–15 mm. The reason is that, when the neck 6a has a diameter of less than 5 mm, it is difficult to obtain a sufficient load capacity to a heavy single crystal. When the neck 6a has a diameter of more than 15 mm, it is difficult to obtain a planer heat distribution in the neck 6a during the formation of the neck 6a, so that a thermal stress which affects the neck 6a becomes large, leading to the lowered dislocation elimination ability in the neck 6a.

By slowing down the pulling speed of the pulling axis 14, the single crystal 6 is grown to have a prescribed diameter (12 inches or so), leading to the formation of a shoulder 6b (FIG. 7(d)). Then, the single crystal 6 is pulled at a prescribed speed, leading to the formation of the main body 6c (FIG. 7(e)).

Then, in the same manner as described in the above mentioned Relevant Art, the single crystal 6 is pulled, is separated from the melt 13, and is cooled, leading to the completion of the pulling of the single crystal 6.

The apparatus for pulling a single crystal according to Embodiment (3) is described below.

Since the apparatus for pulling a single crystal according to Embodiment (3) has the same construction as the conventional apparatus for pulling a single crystal shown in FIG. 1 except that an auxiliary heating means is arranged therein, only the part related to the auxiliary heating means is described here.

Figure 8:
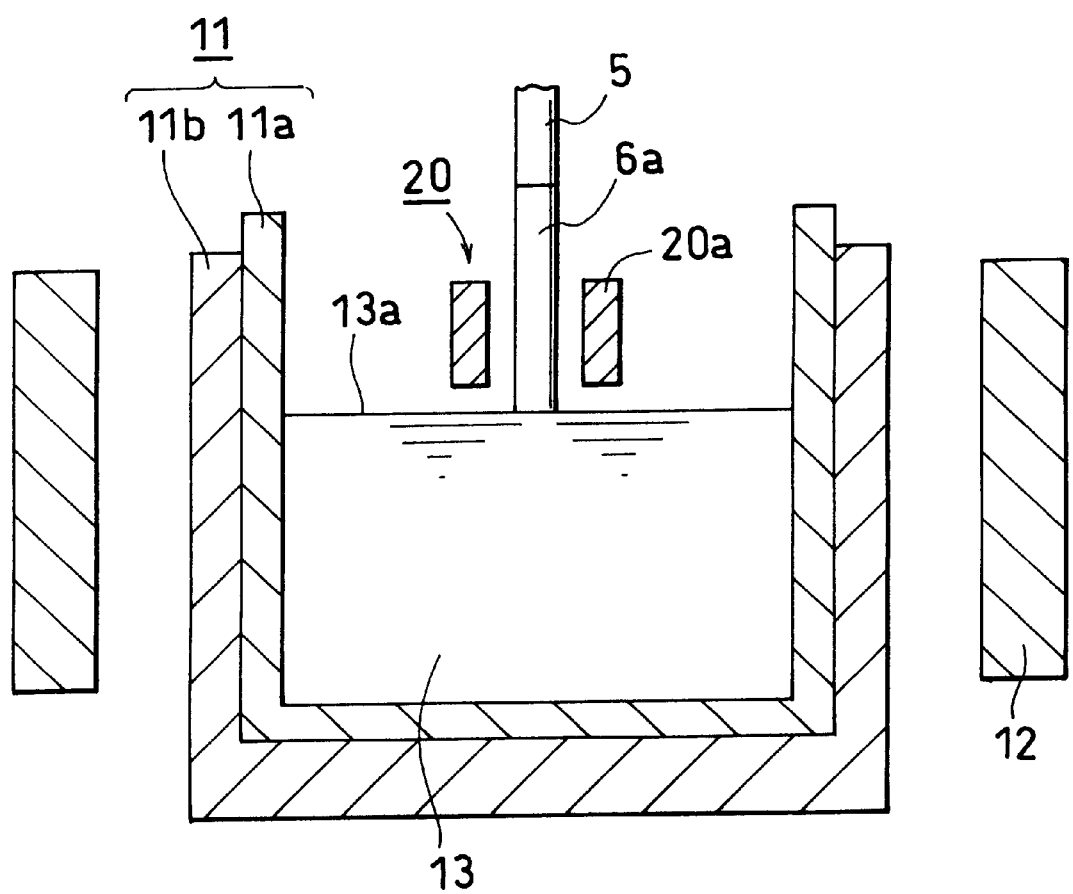
FIG. 8 is a diagrammatic sectional view showing the principal part of an apparatus for pulling a single crystal according to Embodiment (3).

FIG. 8 is a diagrammatic sectional view showing the principal part of the apparatus for pulling a single crystal according to Embodiment (3). Reference numeral 20 represents an auxiliary heating means. A body 20a of the auxiliary heating means 20 is made of carbon, and is arranged so as to surround a seed crystal 5, a neck 6a, and the like. In growing a main body 6c and the like, it is not desired that the body 20a be located around a single crystal 6. Therefore, the auxiliary heating means 20 has a transfer mechanism (not shown) and/or an arm by which the body 20a can be pulled upward after the contact of the seed crystal 5 with the melt 13 and during the formation of the neck 6a.

By using the apparatus for pulling a single crystal according to the Embodiment (3), too, the temperature of the front portion 5a of the seed crystal 5 can be raised close to that of the melt 13 before bringing the seed crystal 5 into contact with the melt 13, and the neck 6a can be formed with heating.

By making up a new apparatus for pulling a single crystal using a combination of each characteristic of the apparatus for pulling a single crystal according to the Embodiments (1)–(3), it becomes possible to more easily and uniformly raise the temperature of the front portion 5a of the seed crystal 5 close to that of the melt 13, and to form the neck 6a with heating. As a new apparatus for pulling a single crystal using a combination of the characteristics, an apparatus for pulling a single crystal which has both a crucible 11 having plural through holes 11c and an auxiliary heating means 20 can be exemplified.

In the methods for pulling a single crystal using the apparatus for pulling a single crystal according to the Embodiments (1)–(3), the case where the radiant quantities of the heater 12 to both the seed crystal 5 and the neck 6a are increased is described, but the present invention is not limited to the methods according to the Embodiments. A method for pulling a single crystal 6 wherein only the radiant quantity to the seed crystal 5 is increased and the neck 6a is not formed, or a method for pulling a single crystal 6 wherein only the radiant quantity to the neck 6a is increased so that the dislocation elimination ability in the neck 6a is increased, can be included as a matter of course.

EXAMPLES AND COMPARATIVE EXAMPLES

The methods and apparatus for pulling a single crystal according to Examples are described below.

Examples 1–4

In Examples 1–4, an apparatus for pulling a single crystal according to the Embodiment (1) was used. As a comparison, the case where a single crystal was pulled by a conventional method (Comparative Example 1) and the case where a high-strength mechanical holding portion was formed to pull a single crystal (Comparative Example 2 (Japanese Kokai No. 62-288191)), using a conventional apparatus for pulling a single crystal used for the CZ method (FIG. 1), are also described. The conditions are as follows.

[Common conditions to Examples 1–4, and Comparative Examples 1 and 2]

Prepared quantity of material for crystal: 300 kg

Atmosphere in chamber 19: Ar atmosphere
  Flow of Ar: 100 liter/min
  Pressure in crucible: 400 Pa Inner diameter of crucible 11: 30 inches Shape of single crystal 6 or 16 to be pulled
  Diameter: 300 mm
  Length: 1600 mm Number of pulls: 10 times The individual conditions, and the DF (Dislocation Free) rate and the number of falls of the single crystals 6 or 16 in each case are shown in Table 1.

TABLE 1

| | Width of gap | Diameter of seed crystal | Diameter of neck | Number of falls (/10) | DF rate | Remarks |
|---|---|---|---|---|---|---|
| Comparative Example 1 | 20 mm | 15 mm | 4 mm | 10 | — | Conventional method |
| Comparative Example 2 | 20 mm | 15 mm | 4 mm | 0 | 50% | Mechanical holding method |
| Example 1 | 80 mm | 7 mm | 7 mm | 0 | 100% | |
| Example 2 | 50 mm | 7 mm | 7 mm | 0 | 80% | |
| Example 3 | 80 mm | 15 mm | 7 mm | 0 | 90% | |
| Example 4 | 80 mm | 11 mm | 11 mm | 0 | 70% | |

As is obvious from the results shown in Table 1, in each of the Examples 1–4, the number of dislocations induced to the seed crystals 5 decreased and in addition, the dislocation elimination ability in the necks 6a increased, resulting in the DF rate of the pulled single crystals 6 of 70% or more. Since the seed crystals 5 and the necks 6a had sufficiently large diameters to pull heavy single crystals (e.g. a diameter of at least 7 mm), the number of falls was 0 (/10).

On the other hand, in the Comparative Example 1, since the diameters of the necks 16a were narrowed to be 4 mm, it appears that the dislocations were eliminated. But the single crystals 16 could not be supported sufficiently, so that the number of falls was 10 (/10), or all of the single crystals 16 fell. In the Comparative Example 2, since the mechanical holding method was adopted, the number of falls was 0 (/10). But since it was difficult to sufficiently lessen (restrict) the shaking in the holding of the high-strength holding portion by the mechanical holding mechanism, the dislocations were induced, resulting in the DF rate of 50%.

From each condition and result in the Examples 1–4, the below ①–③ are derived.

① The DF rate is improved by setting the gap G wide.
  Example 1: Width of gap G (80 mm) DF rate (100%)
  Example 2: Width of gap G (50 mm) DF rate (80%)

② The DF rate is improved by using a seed crystal 5 having a small diameter.

Example 1: Diameter of seed crystal (7 mm) DF rate (100%)

Example 3: Diameter of seed crystal (15 mm) DF rate (90%)

③ The DF rate is improved by forming a neck 6a on a seed crystal 5 having a small diameter.

Example 1: Diameter of seed crystal and neck (7 mm) DF rate (100%)

Example 4: Diameter of seed crystal and neck (11 mm) DF rate (70%)

From the above ①–③, the new knowledge by the present inventors shown in SUMMARY OF THE INVENTION was confirmed.

Examples 5–9

Examples 5–9 wherein an apparatus for pulling a single crystal according to the Embodiment (2) was used are described below. As a comparison, the cases where a single crystal was pulled by a conventional method (Comparative Examples 3 and 5) and the case where a high-strength mechanical holding portion was formed to pull a single crystal (Comparative Example 4 (Japanese Kokai No. 62-288191)), using a conventional apparatus for pulling a single crystal used for the CZ method (FIG. 1), are also described. The conditions are as follows. [Common conditions to Examples 5–9, and Comparative Examples 3–5]

Prepared quantity of material for crystal: 300 kg

Atmosphere in chamber 19: Ar atmosphere
   Flow of Ar: 100 liter/min
   Pressure in crucible: 400 Pa Inner diameter of crucible 11: 30 inches Shape of single crystal 6 or 16 to be pulled
   Diameter: 300 mm
   Length: 1600 mm Number of pulls: 5 times The individual conditions, and the DF rate and the number of falls of the single crystals 6 or 16 in each case are shown in Table 2. Here, the through hole opening ratio is a ratio of the total horizontal length of plural through holes 11c to the perimeter of a crucible 11.

diameters to pull heavy single crystals (e.g. a diameter of at least 8 mm), the number of falls was 0 (/5).

On the other hand, in the Comparative Example 3, since the diameters of the seed crystals 15 and the necks 16a were 4 mm, which were small, it appears that the dislocations were eliminated. But the single crystals 16 could not be supported sufficiently, so that the number of falls was 5 (/5), or all of the single crystals 16 fell.

In the Comparative Example 4, since the mechanical holding method was adopted, the number of falls was 0 (/5). though the diameters of the seed crystals 15 and the necks 16a were small (4 mm). But since it was difficult to sufficiently lessen (restrict) the shaking in the holding of the high-strength holding portion by the mechanical holding mechanism, the dislocations were induced, resulting in the DF rate of 40%.

In the Comparative Example 5, since the diameters of the seed crystals 15 and the necks 16a were 8 mm, which were large, the number of falls was favorably 0 (/5). But the dislocations induced to the single crystals 16 could be hardly eliminated, resulting in the DF rate of 0%.

From each condition and result in the Examples 5–9, the below ①–③ are derived.

① The DF rate is improved by setting the through hole opening ratio large.

Example 5: Through hole opening ratio (5%) DF rate (60%)

Example 6: Through hole opening ratio (40%) DF rate (100%)

② The DF rate is improved by setting the height H of through hole 11c high.

Example 6: Height H (64 mm) DF rate (100%)

Example 7: Height H (32 mm) DF rate (80%)

Example 8: Height H (128 mm) DF rate (100%)

③ The DF rate is improved by forming a neck 6a on a seed crystal 5 having a small diameter.

Example 6: Diameter of seed crystal and neck (8 mm) DF rate (100%)

Example 9: Diameter of seed crystal and neck (14 mm) DF rate (20%)

From the above ①–③, the new knowledge by the present inventors shown in SUMMARY OF THE INVENTION was confirmed.

TABLE 2

| | through hole opening ratio | Height of through hole | Diameter of seed crystal and neck | Number of falls ( /5) | DF rate | Remarks |
|---|---|---|---|---|---|---|
| Comparative Example 3 | 0% | 0 mm | 4 mm | 5 | — | Conventional method |
| Comparative Example 4 | 0% | 0 mm | 4 mm | 0 | 40% | Mechanical holding method |
| Comparative Example 5 | 0% | 0 mm | 8 mm | 0 | 0% | Conventional method |
| Example 5 | 5% | 64 mm | 8 mm | 0 | 60% | |
| Example 6 | 40% | 64 mm | 8 mm | 0 | 100% | |
| Example 7 | 40% | 32 mm | 8 mm | 0 | 80% | |
| Example 8 | 40% | 128 mm | 8 mm | 0 | 100% | |
| Example 9 | 40% | 65 mm | 14 mm | 0 | 20% | |

As is obvious from the results shown in Table 2, in each of the Examples 6–8, the number of dislocations induced to the seed crystals 5 decreased and in addition, the dislocation elimination ability in the necks 6a increased, resulting in the DF rate of the pulled single crystals 6 of 80% or more. Since the seed crystals 5 and the necks 6a had sufficiently large Examples 10–13

Examples 10—13 wherein an apparatus for pulling a single crystal according to the Embodiment (3) was used are described below. As a comparison, the cases where a single crystal was pulled by a conventional method (Comparative Examples 6 and 8) and the case where a high-strength mechanical holding portion was formed to pull a single crystal (Comparative Example 7 (Japanese Kokai No. 62-288191)), using a conventional apparatus for pulling a single crystal used for the CZ method (FIG. 1), are also described. The conditions are as follows.

[Common conditions to Examples 10–13, and Comparative Examples 6–8]

Prepared quantity of material for crystal: 300 kg

Atmosphere in chamber 19: Ar atmosphere
    Flow of Ar: 100 liter/min
    Pressure in crucible: 400 Pa Inner diameter of crucible 11: 30 inches Shape of single crystal 6 or 16 to be pulled
    Diameter: 300 mm
    Length: 1600 mm Number of pulls: 5 times The individual conditions, and the DF rate and the number of falls of the single crystals 6 or 16 in each case are shown in Table 3. Here, the front temperature of seed crystal is the temperature of the front portion of the seed crystal 5 or 15 before the seed crystal 5 or 15 is brought into contact with a melt 13, and the power in neck is a heating power of an auxiliary heating means 20 during the formation of a neck 6a.

dislocations induced to the single crystals 16 could be hardly eliminated, resulting in the DF rate of 0%.

From each condition and result in the Examples 10–13, the below ① and ③ are derived.

① The DF rate is improved by increasing a heating power during the formation of a neck 6a.
    Example 10: Heating power (1 kW) DF rate (100%)
    Example 12: Heating power (0.5 kW) DF rate (80%)

② The DF rate is improved by forming a neck 6a on a seed crystal 5 having a small diameter.
    Example 10: Diameter of seed crystal and neck (8 mm) DF rate (100%)
    Example 11: Diameter of seed crystal and neck (14 mm) DF rate (40%)

From the above ① and ②, the new knowledge by the present inventors shown in SUMMARY OF THE INVENTION was confirmed.

What is claimed is:

1. A method for pulling a single crystal from a melt, using an apparatus for pulling a single crystal comprising a crucible charged with a melt, a heater located around the crucible, and a straightening vane having a body surrounding a pulled single crystal, said straightening vane has the shape of an inverted truncated cone or a cylinder in which

TABLE 3

| | Front temperature of seed crystal | Power in neck | Diameter of seed crystal and neck | Number of falls (/5) | DF rate | Remarks |
|---|---|---|---|---|---|---|
| Comparative Example 6 | ~1300° C. | — | 4 mm | 5 | — | Conventional method |
| Comparative Example 7 | ~1300° C. | — | 4 mm | 0 | 40% | Mechanical holding method |
| Comparative Example 8 | ~1380° C. | — | 8 mm | 0 | 0% | Conventional method |
| Example 10 | 1380~1390° C. | 1 kW | 8 mm | 0 | 100% | |
| Example 11 | 1380~1390° C. | 1 kW | 14 mm | 0 | 40% | |
| Example 12 | 1380~1390° C. | 0.5 kW | 8 mm | 0 | 80% | |
| Example 13 | 1380~1390° C. | 1 kW | 8 mm | 0 | 100% | |

As is obvious from the results shown in Table 3, in each of the Examples 10, 12, and 13, the number of dislocations induced to the seed crystals 5 decreased and in addition, the dislocation elimination ability in the necks 6a increased, resulting in the DF rate of the pulled single crystals 6 of 80% or more. Since the seed crystals 5 and the necks 6a had sufficiently large diameters to pull heavy single crystals (e.g. a diameter of at least 8 mm), the number of falls was 0 (/5).

On the other hand, in the Comparative Example 6, since the diameters of the seed crystals 15 and the necks 16a were 4 mm, which were small, it appears that the dislocations were eliminated. But the single crystals 16 could not be supported sufficiently, so that the number of falls was 5 (/5), or all of the single crystals 16 fell.

In the Comparative Example 7, since the mechanical holding method was adopted, the number of falls was 0 (/5), though the diameters of the seed crystals 15 and the necks 16a were small (4 mm). But since it was difficult to sufficiently lessen (restrict) the shaking in the holding of the high-strength holding portion by the mechanical holding mechanism, the dislocations were induced, resulting in the DF rate of 40%.

In the Comparative Example 8, since the diameters of the seed crystals 15 and the necks 16a were 8 mm, which were large, the number of falls was favorably 0 (/5). But the the upper and lower planes are removed, said straightening vane is located above the crucible and has a lower end portion, wherein the distance between the lower end portion of the straightening vane body and the surface of the melt charged in the crucible, said distance is called the gap, is variable, said method comprising:

raising the temperature of the front portion of a seed crystal into the range of 1380–1480° C., via heat from the heater surrounding the crucible, wherein the gap is set in the range of 30–200 mm and the seed crystal has a diameter of 5–15 mm and is a pillar;

bringing the seed crystal into contact with the melt without further lowering the seed crystal after contact with the melt; and pulling a single crystal without forming a neck.

2. A method for pulling a single crystal from a melt, using an apparatus for pulling a single crystal comprising a crucible charged with a melt, said crucible has an upper part having through holes and/or slits, and a heater located around the crucible, said method comprising:

raising the temperature of the front portion of a seed crystal into the range of 1380–1480° C., wherein the seed crystal has a diameter of 5–15 mm and is a pillar;

bringing the seed crystal into contact with the melt without further lowering the seed crystal after contact with the melt; and pulling a single crystal without forming a neck.

3. A method for pulling a single crystal from a melt, using an apparatus for pulling a single crystal comprising a crucible charged with a melt, said crucible has an upper body containing through holes and/or slits, and a heater located around the crucible, said method comprising:

bringing a seed crystal into contact with the melt without further lowering the seed crystal after contact with the melt, wherein the seed crystal has a diameter of 5–15 mm and is a pillar;

forming a neck with heating from said heater;

forming a shoulder; and pulling a main body single crystal.

4. The method of claim 3, wherein the neck formed has a diameter of about 5–15 mm.

5. The method of claims 2 or 3, wherein the through holes and/or slits have a ratio of the total horizontal length of 10% or more in relation to the perimeter of the crucible.

6. The method of claim 2 or 3, wherein the apparatus further comprises a straightening vane having a body surrounding a pulled single crystal, said straightening vane has the shape of an inverted truncated cone or a cylinder in which the upper and lower planes are removed, said straightening vane is located above the crucible and has a lower end portion, wherein the distance between the lower end portion and the melt charged in the crucible, called the gap, is variable.

7. The method of claim 6, wherein the gap for the straightening vane is set in the range of 30–200 mm.

8. A method for pulling a single crystal from a melt, using an apparatus for pulling a single crystal comprising a crucible charged with a melt, a heater located around the crucible, and an auxiliary heating means which has a body that surrounds a seed crystal located near and above the melt surface and a transfer mechanism for pulling the body of the auxiliary heating means, said method comprising:

raising the temperature of the front portion of a seed crystal into the range of 1380–1480° C., using the auxiliary heating means, wherein the seed crystal has a diameter of 5–15 mm and is a pillar;

bringing the seed crystal into contact with the melt without further lowering the seed crystal after contact with the melt; and pulling a single crystal without forming a neck.

9. A method for pulling a single crystal from a melt, using an apparatus for pulling a single crystal comprising a crucible charged with a melt, a heater located around the crucible, and a straightening vane having a body surrounding a pulled single crystal, said straightening vane has the shape of an inverted truncated cone or a cylinder in which the upper and lower planes are removed, said straightened vane above is between the crucible and has a lower end portion, wherein the distance between the lower end portion of the straightened vane body and the surface of the melt charged in the crucible, said distance is called the gap, is variable, said method comprising:

bringing a seed crystal into contact with the melt without further lowering the seed crystal after contact with the melt, wherein the seed crystal has a diameter of 5–15 mm and is a pillar;

forming a neck having a diameter of 5 to 15 mm with heating from said heaters, wherein the gap is set in the range of 30–200 mm;

forming a shoulder; and pulling a main body single crystal.

10. A method for pulling a single crystal from a melt, using an apparatus for pulling a single crystal comprising a crucible charged with a melt, a heater located around the crucible, and an auxiliary heating means which has a body which surrounds a seed crystal located near and above the melt surface and a transfer mechanism for the body of the auxiliary heating means, said method comprising:

bringing the seed crystal into contact with the melt without further lowering the seed crystal after contact with the melt, wherein the seed crystal has a diameter of 5–15 mm and is a pillar;

forming a neck having a diameter of 5–15 mm with heating, using the auxiliary heating means;

forming a shoulder; and pulling a main body single crystal.

* * * * *